United States Patent [19]
Tamaki et al.

[11] Patent Number: 6,136,668
[45] Date of Patent: Oct. 24, 2000

[54] METHOD OF DICING SEMICONDUCTOR WAFER

[75] Inventors: Masahiro Tamaki; Kazuo Hayashi; Shozui Takeno, all of Hyogo, Japan

[73] Assignee: Mitsubishi Denki Kabushiki Kaisha, Tokyo, Japan

[21] Appl. No.: 09/169,928

[22] Filed: Oct. 9, 1998

Related U.S. Application Data

[63] Continuation of application No. PCT/JP96/02758, Sep. 24, 1996.

[51] Int. Cl.⁷ .................................................. H01L 21/304
[52] U.S. Cl. .......................... 438/462; 438/463; 438/464; 438/465
[58] Field of Search .................................... 438/462, 463, 438/464, 465, FOR 387; 148/DIG. 28

[56] References Cited

U.S. PATENT DOCUMENTS 3,970,819  7/1976  Gates et al. .
5,552,345  9/1996  Schrantz et al. .

FOREIGN PATENT DOCUMENTS 52-140275  11/1977  Japan .
56-62334   5/1981   Japan .
61-95544   5/1986   Japan .
62-249418  10/1987  Japan .
8-264491   10/1996  Japan .

*Primary Examiner*—George Fourson
*Attorney, Agent, or Firm*—McDermott, Will & Emery

[57] ABSTRACT

A semiconductor wafer is prepared which includes a semiconductor layer having on its surface a plurality of functional devices, and a separation line region surrounding and separating the plurality of functional devices from one another. A metal layer is formed on the surface of separation line region of semiconductor region. A reinforcing layer is formed on the surface of semiconductor wafer. By selectively etching the back surface of semiconductor layer, a hole is formed to surround the peripheries of functional device, passing through semiconductor layer and reaching from the back surface to metal layer. Reinforcing plate is removed from semiconductor wafer. Metal layer is irradiated with laser and fused to provide a plurality of semiconductor chips separated from one another.

4 Claims, 18 Drawing Sheets

6,136,668

METHOD OF DICING SEMICONDUCTOR WAFER

REFERENCE TO RELATED APPLICATION

This application is a continuation of International Application No. PCT/JP96/02758, whose international filing date is Sep. 24, 1996, the disclosure of which is incorporated by reference herein.

BACKGROUND OF THE INVENTION

1. Field of the Invention

The present invention relates to semiconductor devices and methods of manufacturing the same, and more specifically, to a method of dividing a semiconductor wafer into semiconductor chips and to the structure of the semiconductor chip obtained from the same.

2. Description of the Background Art

Presently, a dicing method is mainly used for dividing a compound semiconductor wafer into semiconductor chips. Now, a method of dividing the semiconductor wafer using the dicing method will be described.

FIGS. 28 to 30 are schematic plan views sequentially showing the steps of the method of dividing the semiconductor wafer using the dicing method. In addition, FIGS. 31 to 33 are schematic cross sectional views taken along the lines G—G in FIGS. 28 to 30.

Referring firstly to FIGS. 28 and 31, a plurality of functional devices 3 are arranged and formed spaced apart from one another by a dicing line region 2 on the surface of a semiconductor layer 1 of a semiconductor wafer 4c. Thereafter, the back surface of semiconductor layer 1 is polished by means for example of a polishing method, so that the thickness of semiconductor wafer 4c is made as small as 400 $\mu$m or less. On the back surface of the thin semiconductor layer 1, a metal layer 5 is formed with a thickness of 1 $\mu$m or less as a layer for solder adhesion in die bonding a semiconductor chip to a package.

Referring to FIGS. 29 and 32, metal layer 5 on the back surface of semiconductor wafer 4c, thus prepared, is applied to an expand sheet 23 which is expandable. Thereafter, semiconductor wafer 4c is cut along dicing line region 2 by a dicing saw.

Referring to FIGS. 30 and 33, by cutting semiconductor wafer 4c, it is divided into separate semiconductor chips 10c. Then, expansion of expand sheet 23 increases the spaces between separate semiconductor chips 10c, thus facilitating removal (recovery) of separate semiconductor chips 10c.

It is noted that grooves 23a are formed to some extent in expand sheet 23 during dicing of semiconductor wafer 4c.

FIG. 34 is a perspective view schematically showing the structure of semiconductor chip 10c which is obtained from the dicing. In addition, FIGS. 35 and 36 are schematic cross sectional views taken along the lines H—H and I—I in FIG. 34.

Referring to FIGS. 34 to 36, for separate semiconductor chip 10c obtained from the above mentioned dicing, functional device 3 is formed on the surface of semiconductor layer 1, and a dicing line region 2a, on which the device has not been formed, surrounds the periphery of functional device 3. Metal layer 5 is also formed on the entire back surface of semiconductor layer 1.

Among the above mentioned compound semiconductor devices, especially in the device such as a high output FET (Field Effect Transistor) which requires thermal resistance reduction, the thickness of semiconductor wafer 4c must be made as small as 50 $\mu$m or less, as shown in FIGS. 28 and 31. With such a small thickness as 50 $\mu$m or less, semiconductor wafer 4c may crack during handling. Then, metal layer 5 with a thickness of 1 $\mu$m or more must be formed on the back surface of semiconductor wafer 4c to reinforce it.

However, if dicing is performed with metal layer 5 formed, metal of metal layer 5 disadvantageously adheres to the dicing saw to cause clogging or rapid wearing of the saw.

To solve this problem, a wet etching method has conventionally been employed as a method of dividing a semiconductor wafer with a thickness of 50 $\mu$m or less. Now, the method of dividing the semiconductor wafer using the wet etching method will be described.

FIGS. 37 to 39 are schematic plan views and a diagram sequentially showing the steps of the method of dividing the semiconductor wafer using the wet etching method. In addition, FIGS. 40 and 41 are schematic cross sectional views taken along the lines J—J in FIGS. 37 and 38. FIG. 42 is a schematic diagram showing the state of the semiconductor chips corresponding to the step shown in conjunction with FIG. 39.

Referring firstly to FIGS. 37 and 40, a plurality of functional devices 3 are arranged and formed on the surface of a semiconductor layer 1 of a semiconductor wafer 4d such that they are separated from one another by a separation line region 2. The surface of semiconductor wafer 4d with functional devices 3 formed thereon is applied to a reinforcing plate 21, for example of glass, by adhesive material 31. Thus, polishing or the like is performed for the back surface of semiconductor layer 1 and the thickness of semiconductor wafer 4d is made as small as 50 $\mu$m or less. A metal layer 5 is formed on the entire surface of thin semiconductor wafer 4d. Metal layer 5 is patterned by means of usual photolithography and left on the back surface of semiconductor layer 1 in the position corresponding to functional device 3. Semiconductor wafer 4d is wet etched using the patterned metal layer 5 as a mask.

Referring to FIG. 41, the wet etching forms a groove passing through semiconductor layer 1, so that semiconductor wafer 4d is divided into a plurality of semiconductor chips 10d. In this state, semiconductor chips 10d and reinforcing plate 21 are dipped into organic solvent for melting adhesive material 31.

Referring to FIGS. 39 and 42, the dipping in organic solvent 50 allows adhesive material 31 to melt, so that semiconductor chips 10d come off from reinforcing plate 21.

FIG. 43 is a perspective view schematically showing the structure of separate semiconductor chip 10d obtained from the wet etching. In addition, FIGS. 44 and 45 are schematic cross sectional views taken along the lines K—K and L—L in FIG. 43.

Referring to FIGS. 43 to 45, in the separate semiconductor chip 10d obtained from the above mentioned wet etching, functional device 3 is formed on the surface of semiconductor layer 1, and a region 2b for separation of chips, on which the device has not been formed, surrounds functional device 3. Metal layer 5 is also formed on the entire back surface of semiconductor layer 1, with its ends outwardly protruding from the ends of the back surface of semiconductor layer 1. In addition, the sides of semiconductor layer 1 is made narrower as closer to the back surface with metal layer 5 from the surface with functional device 3.

According to the method using the wet etching, clogging of a dicing saw with metal layer 5 does not occur as a dicing method is not employed.

In this method, however, semiconductor chips 10d would scatter in organic solvent 50 as shown in FIGS. 39 and 42. With semiconductor chip 10d thus scattered and not regularly arranged, a significant amount of time is required for picking up semiconductor chips 10d by handling with pincette.

Furthermore, semiconductor chips 10d collide with one another or with a recipient many times when recovering the scattered chips moving them to another recipient in the atmosphere after they are dried. Thus, many scratches are formed and a number of fragments adhere to the surface of semiconductor chips 10d, thereby deteriorating the appearance of most semiconductor chips 10d.

SUMMARY OF THE INVENTION

The present invention is made to solve the aforementioned problems, and an object of the present invention is to provide a semiconductor device for which clogging or wearing of a dicing saw is prevented, recovery of semiconductor chips by a pincette is facilitated, and deterioration of the appearance of semiconductor chips are not easily allowed, as well as to provide a method of manufacturing such semiconductor device.

A method of manufacturing a semiconductor device according to one aspect of the present invention includes the following steps.

A semiconductor wafer is prepared which includes a semiconductor layer having a plurality of device formation regions with mutually opposite first and second main surfaces and functional devices, and a separation region surrounding the peripheries of the device formation regions in both the first and second main surfaces for separating the plurality of device formation regions from one another. Then, a metal layer is formed on the first main surface of the semiconductor layer in the separation region to surround the peripheries of the device formation regions. A reinforcing layer is applied to the semiconductor wafer to cover the entire first main surface. The separation region in the second main surface for the semiconductor layer is selectively etched to form a hole passing from the second main surface only to the metal layer and surrounding the device formation regions. Then, the reinforcing layer is removed from the semiconductor wafer. The metal layer is irradiated with laser, melted and disconnected, whereby the plurality of device formation regions are divided into semiconductor chips.

In the method of manufacturing the semiconductor device according to the present invention, the semiconductor wafer is divided into semiconductor chips by means of etching and laser melting. Thus, clogging with the metal layer and wearing of the dicing saw is prevented as the semiconductor wafer is not divided by dicing.

In addition, each of semiconductor layers obtained from the semiconductor wafer are connected with one another by the metal layers in removing the reinforcing layer from the semiconductor wafer. Thus, separate semiconductor layers are not scattered in organic solvent. In addition, the metal layers are finally disconnected by laser melting to divide the semiconductor chips. As a result, the semiconductor chips are not scattered when they are divided into separate chips. Thus, additional time required for recovering the scattering semiconductor chips is avoided. In addition, deterioration of the appearance resulting from the scattering semiconductor chips colliding with one another as well as from the fragments of the semiconductor adhering to a chip is prevented.

Preferably, in the above mentioned aspect, an expandable sheet is applied to the second main surface of the semiconductor wafer after the reinforcing layer is removed therefrom. Then, after the metal layers are irradiated with laser from the side of the first main surface to separate the plurality of device formation regions, spaces between the plurality of semiconductor chips are increased by expanding the sheet.

Thus increased spaces between the semiconductor chips facilitate recovery of semiconductor chips, thereby reducing the time required for the recovery.

In the above mentioned aspect, preferably, the semiconductor wafer is prepared to have grooves formed in the separation region so as to surround the device formation regions in the first main surface. The metal layer is formed in the grooves in the first main surface.

The metal layer can be arranged spaced apart from the functional device as it is formed in the groove. In laser melting the metal layer, even if the melted metal scatters, scattering onto the functional device can be prevented.

Further, as the metal layer can be arranged spaced apart from the functional device, a wire contact with the fused metal layer in wire bonding can be prevented.

In the above mentioned aspect, preferably, a second metal layer is formed which covers the entire second main surface of the semiconductor wafer and is kept in contact with the metal layer after the hole is formed. By irradiation with laser, the metal layer and the second metal layer are disconnected by melting.

The formation of the second metal layer can further enhance the effect of reinforcing the semiconductor wafer and prevent the occurrence of cracking or the like.

The semiconductor device according to the present invention includes a semiconductor layer, a metal layer and a laser melted portion.

The semiconductor layer includes a device formation region having a main surface and a functional device. The metal layer is formed on the main surface to surround the periphery of the device formation region. The inner periphery end of the metal layer is spaced apart from the device formation region, whereas the outer periphery end outwardly protrudes from the ends of the main surface of the semiconductor layer. The laser melted portion, of a round form, is formed in the outer periphery end.

In the semiconductor device of the present invention, deterioration of the appearance is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

FIGS. 1 to 7 are schematic plan views sequentially showing the steps of the method of manufacturing the semiconductor device according to the first embodiment of the present invention. FIGS. 8 to 14 are schematic cross sectional views partially showing the portions taken along the lines A—A in FIGS. 1 to 7. It is noted that the views seen from the direction of arrows B in FIGS. 8 to 14 correspond to plan views in FIGS. 1 to 7.

Figure 1:
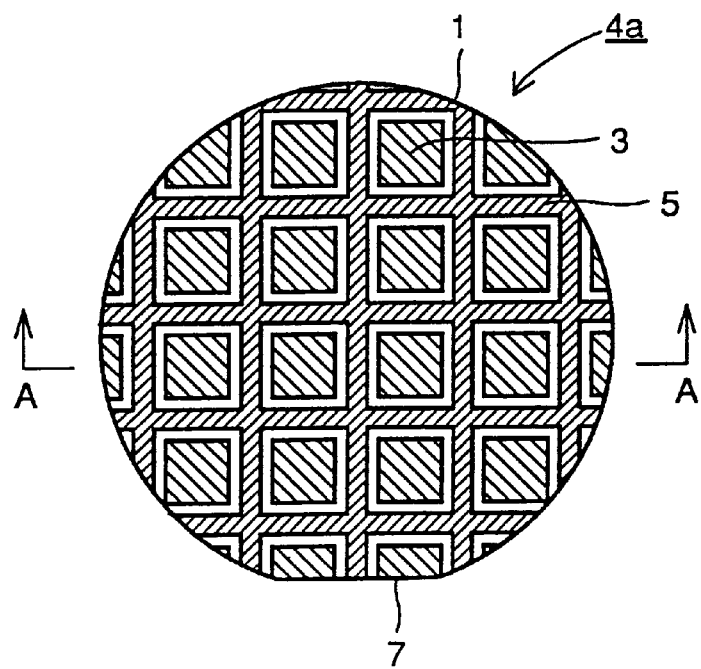
FIG. 1 is a schematic plan view showing a first step of a method of manufacturing a semiconductor device according to a first embodiment of the present invention.
Figure 8:
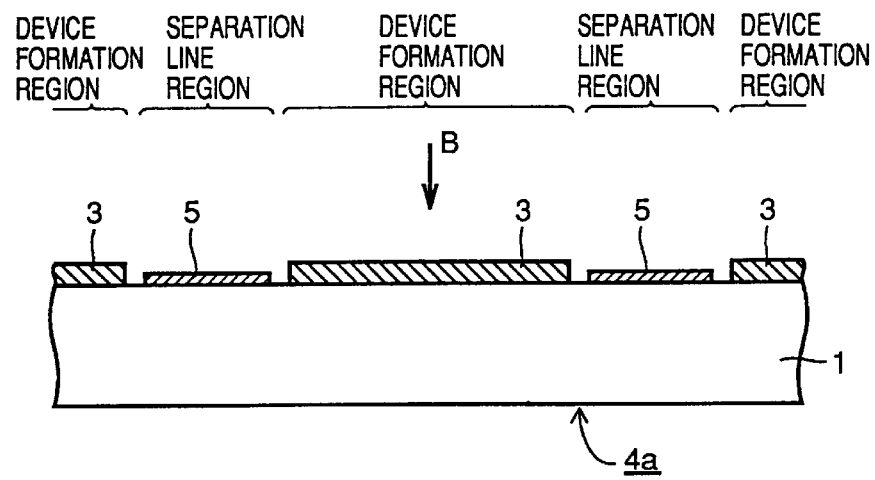
FIG. 8 is a schematic cross sectional view taken along the line A—A in FIG. 1.

Referring firstly to FIGS. 1 and 8, a plurality of device formation regions with functional devices 3 are formed on the surface of a semiconductor layer 1 of a semiconductor wafer 4a. Each of the plurality of device formation regions are surrounded by a separation line region and spaced apart from one another. A metal layer 5 is formed in the separation line region with a prescribed distance apart from functional device 3.

Figure 2:
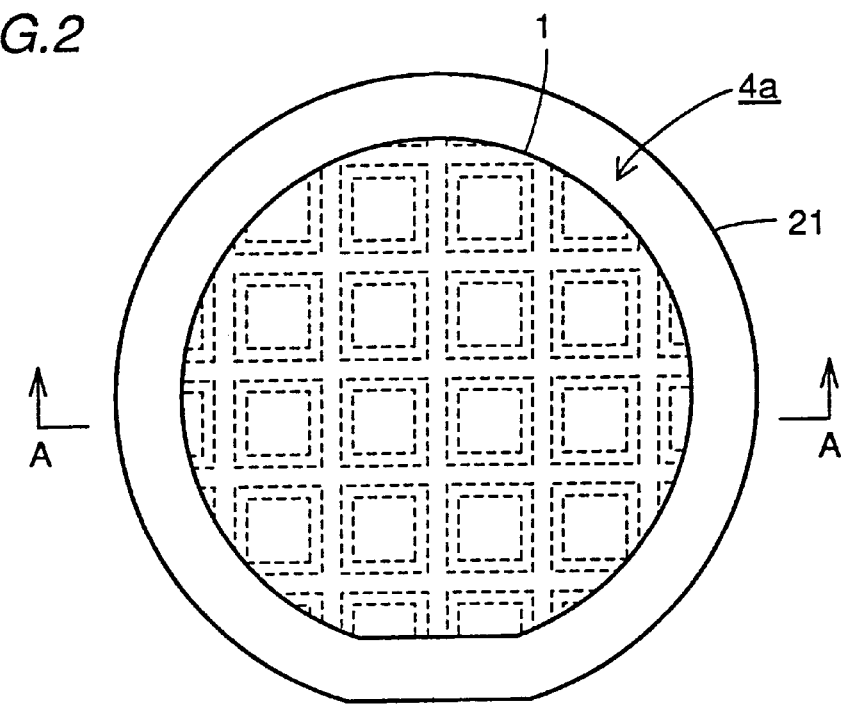
FIG. 2 is a schematic plan view showing a second step of the method of manufacturing the semiconductor device according to the first embodiment of the present invention.
Figure 9:
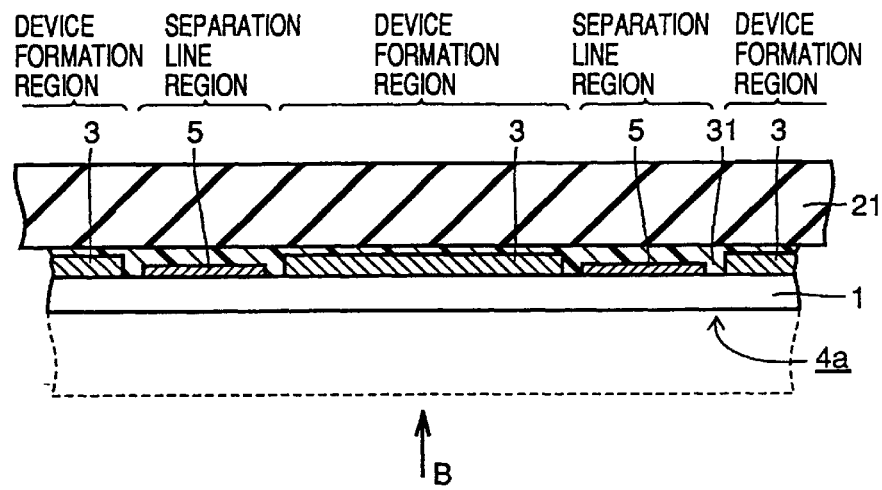
FIG. 9 is a schematic cross sectional view taken along the line A—A in FIG. 2.

Referring to FIGS. 2 and 9, a reinforcing plate 21 is applied on the surface of semiconductor wafer 4a, on which functional device 3 and metal layer 5 have been formed, with adhesive material 31 interposed. Reinforcing plate 21 is formed for example of glass. Thereafter, grinding and polishing processes are performed for the back surface of semiconductor wafer 4a, so that the thickness of semiconductor wafer 4a is made as small as 50 μm or less.

Figure 3:
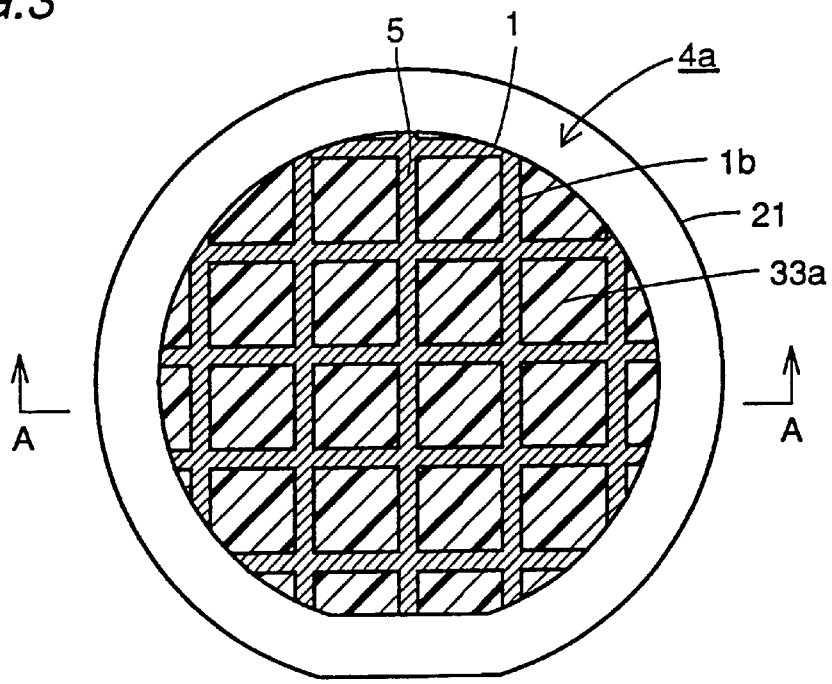
FIG. 3 is a schematic plan view showing a third step of the method of manufacturing the semiconductor device according to the first embodiment of the present invention.
Figure 10:
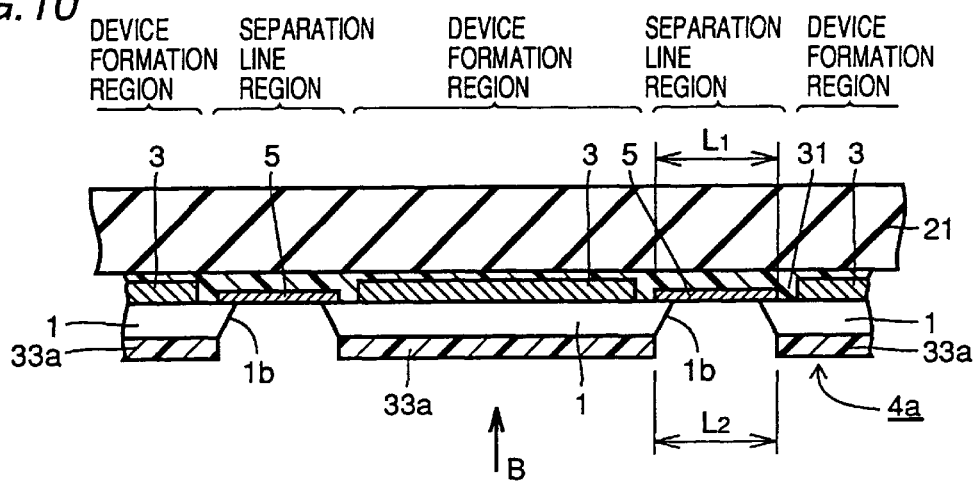
FIG. 10 is a schematic cross sectional view taken along the line A—A in FIG. 3.

Referring to FIGS. 3 and 10, a patterned resist 33a is provided to cover the back surface of semiconductor wafer 4a other than the separation line region by means of photolithography. Semiconductor wafer 4a is etched using patterned resist 33a as a mask. Thus, a hole 1b is formed passing through semiconductor layer 1 to metal layer 5 on the surface, along the separation line region. Thereafter, patterned resist 33a is removed.

It is noted that an opening width $L_2$ of the hole pattern for patterned resist 33a is set smaller than a width $L_1$ of metal layer 1.

Even when semiconductor wafer 4a is made thus thin and having hole 1b, semiconductor layers 1 separated from one another can withstand the subsequent steps of thermal treatment (up to 100° C.) and kept in alignment as they are still connected together by metal layer 5.

Figure 4:
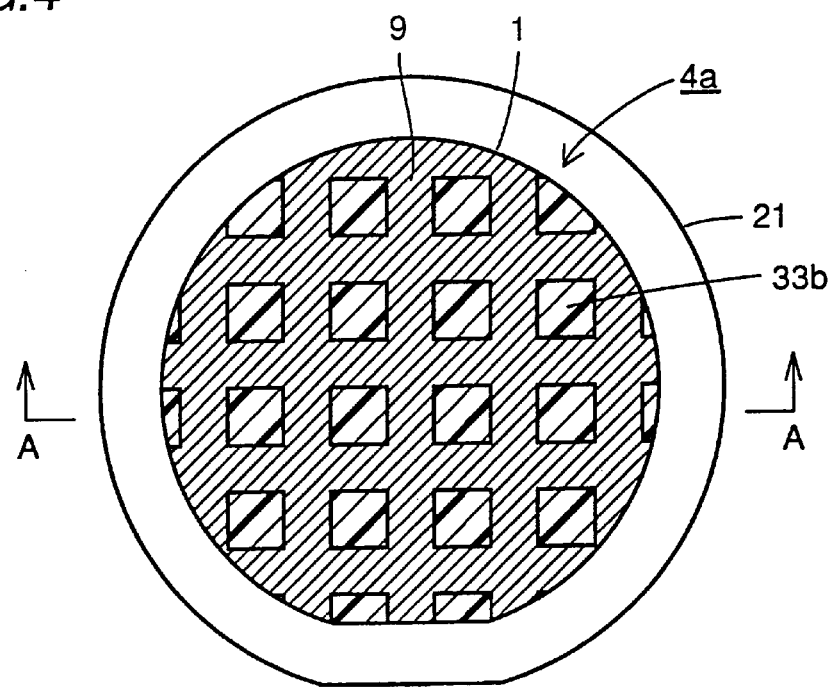
FIG. 4 is a schematic plan view showing a fourth step of the method of manufacturing the semiconductor device according to the first embodiment of the present invention.
Figure 11:
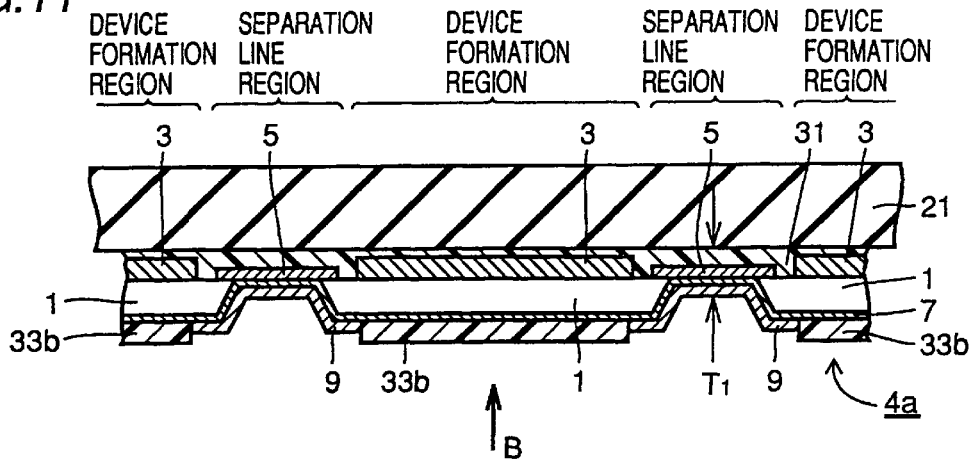
FIG. 11 is a schematic cross sectional view taken along the line A—A in FIG. 4.

Referring to FIGS. 4 and 11, a metal layer 7 is formed on the entire back surface of semiconductor wafer 4a. Subsequently, a patterned resist 33b is formed to cover the back surface of semiconductor wafer 4a other than the separation line region by means of photolithography. In this state, metal layer 7 is electroplated by electrical supply. Thus, a metal plate film 9 is formed on the surface of metal layer 7, over the portion without patterned resist 33b. Metal plate film 9 serves to connect separate semiconductor layers 1 on the back surface of semiconductor wafer 4a and thus reinforce semiconductor wafer 4a. Subsequently, patterned resist 33bis removed.

Figure 5:
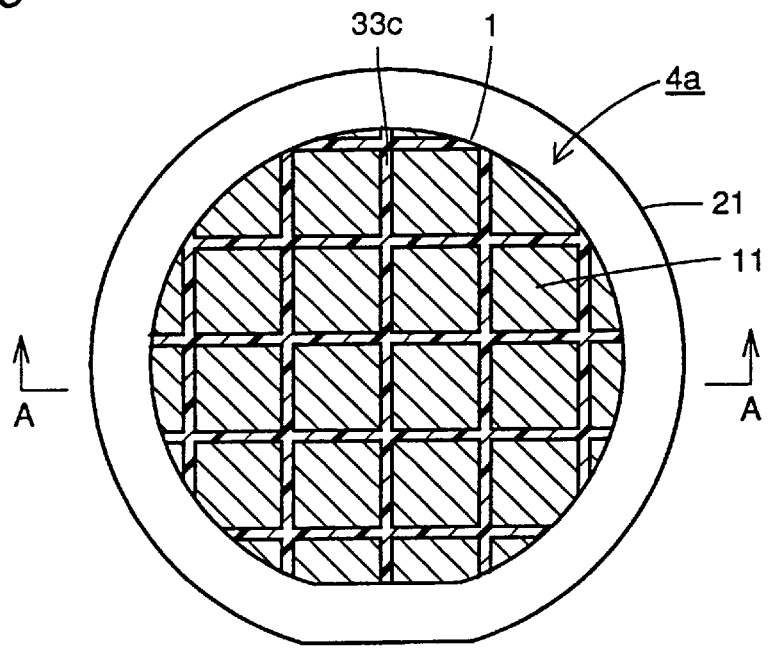
FIG. 5 is a schematic plan view showing a fifth step of the method of manufacturing the semiconductor device according to the first embodiment of the present invention.
Figure 12:
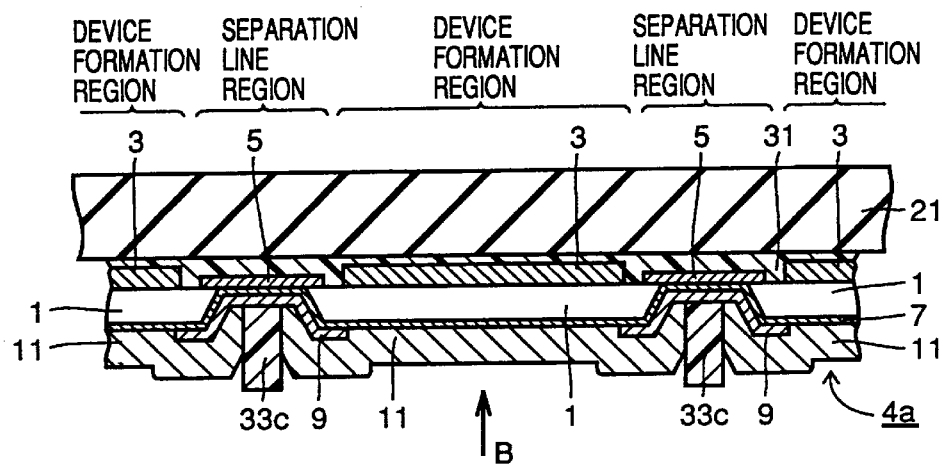
FIG. 12 is a schematic cross sectional view taken along the line A—A in FIG. 5.

Referring to FIGS. 5 and 12, a patterned resist 33c is provided on metal plate film 9 in the separation line region on the back surface of semiconductor wafer 4a by means of photolithography. In this state, metal layer 7 is electroplated by electrical supply, so that an Au (gold) plate film 11 is formed in the device formation region on the back surface of semiconductor wafer 4a. Thereafter, patterned resist 33c is removed.

Subsequently, adhesive material 31 is melted in the organic solvent, whereby reinforcing plate 21 is removed from semiconductor wafer 4a.

Figure 6:
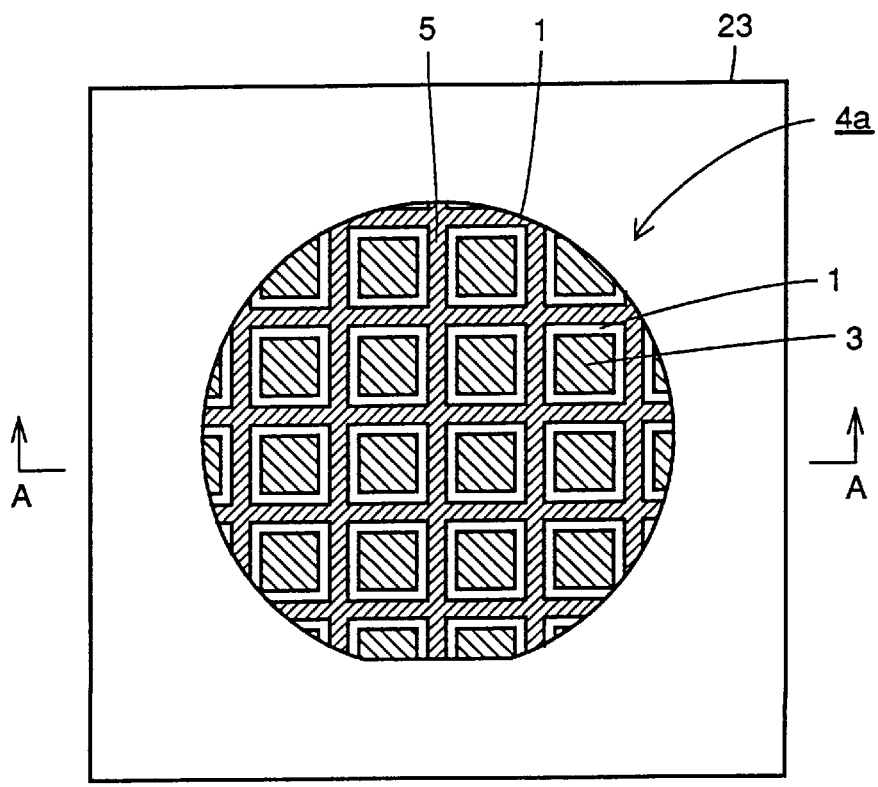
FIG. 6 is a schematic plan view showing a sixth step of the method of manufacturing the semiconductor device according to the first embodiment of the present invention.
Figure 13:
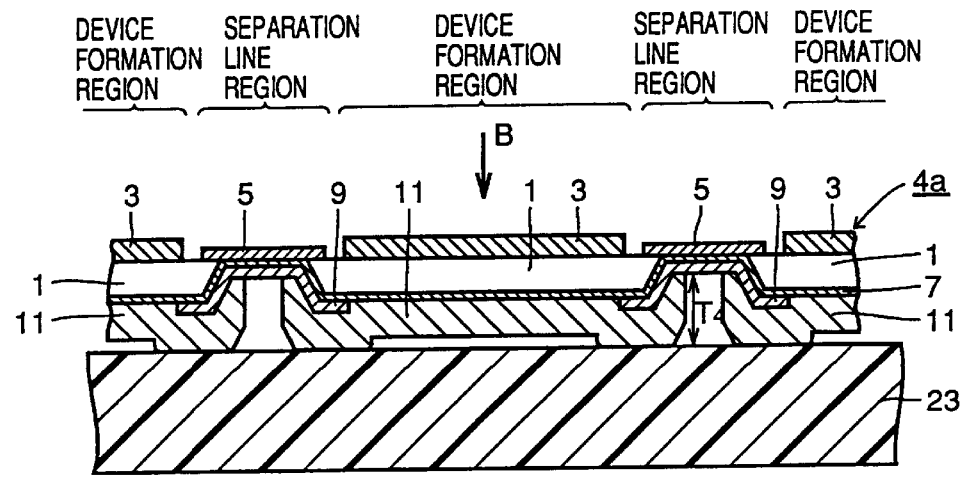
FIG. 13 is a schematic cross sectional view taken along the line A—A in FIG. 6.

Referring to FIGS. 6 and 13, an expand sheet 23 is applied to the back surface of semiconductor wafer 4a. Expand sheet 23 is a resin sheet formed for example of acrylic or polyolefin material commonly used in the semiconductor industry, and has adhesive on its surface.

In this state, metal layer 5 in the separation line region is irradiated with laser beam from the side of the surface of semiconductor wafer 4a.

Figure 7:
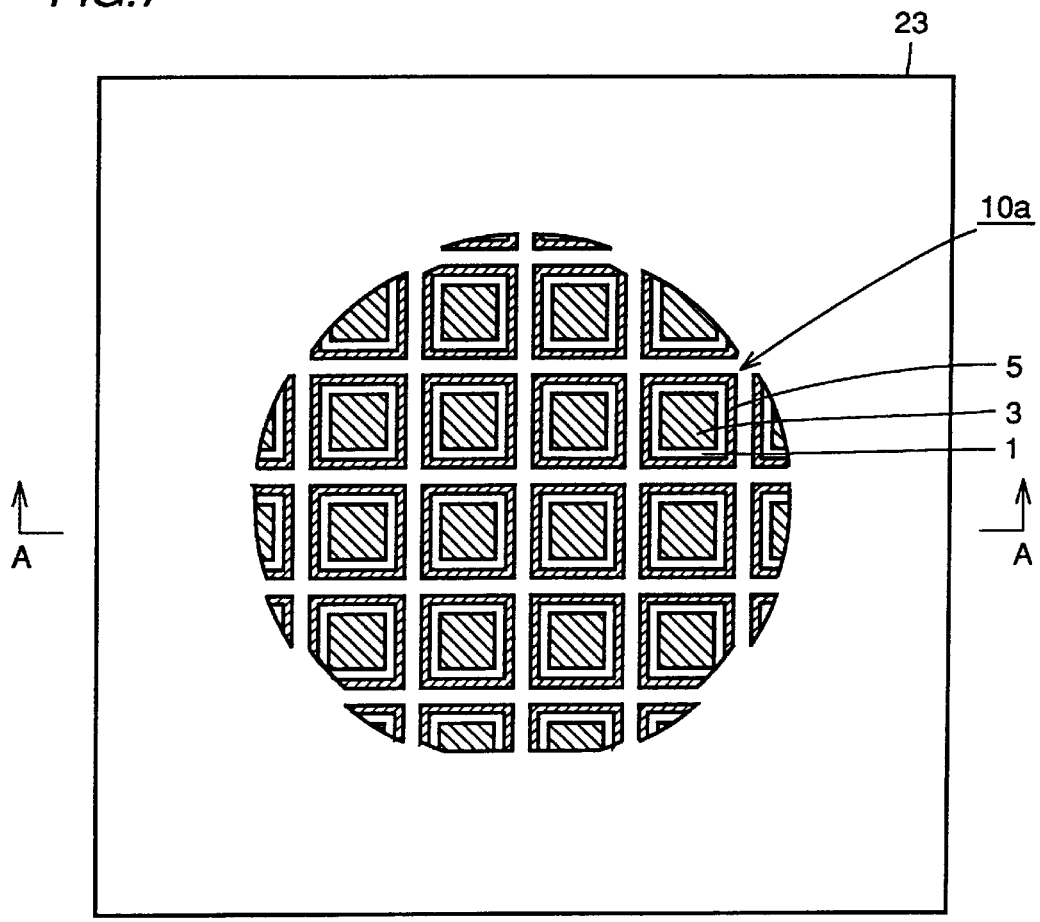
FIG. 7 is a schematic plan view showing a seventh step of the method of manufacturing the semiconductor device according to the first embodiment of the present invention.
Figure 14:
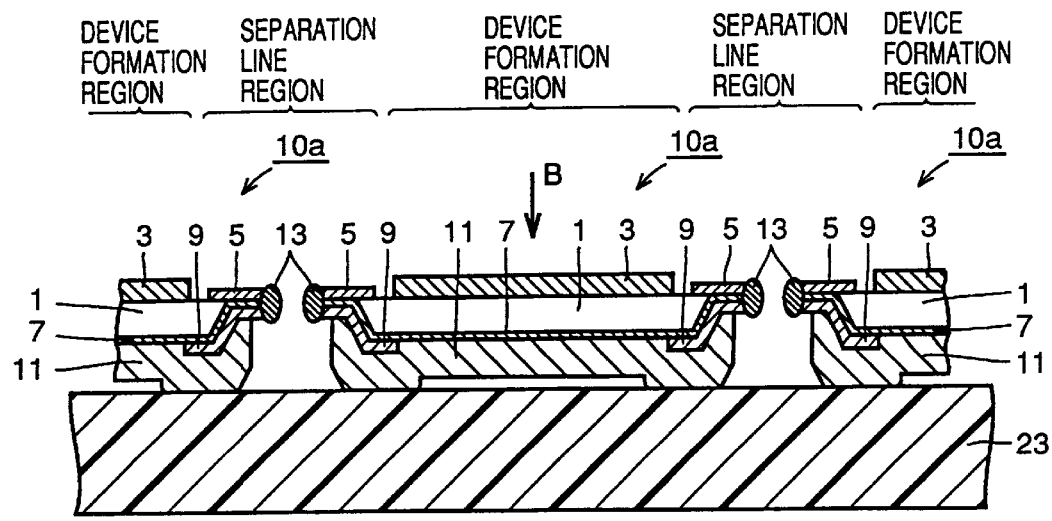
FIG. 14 is a schematic cross sectional view taken along the line A—A in FIG. 7.

Referring to FIGS. 7 and 14, the irradiation with laser beam fuses metal layers 5 and 7 and metal plate film 9, so that semiconductor wafer 4a is divided into separate semiconductor chips 10a. By the irradiation with laser beam, the melted portions of metal layers 5 and 7 and metal plate film 9 would subsequently solidify to form a metal lump 13 of a round form at their ends.

Thereafter, by expanding expand sheet 23 in all directions, spaces between semiconductor chips 10a are increased. Thus, recovery of semiconductor chips 10a by a pincette is facilitated.

Ni (nickel), Cr (chromium) or the like is employed for metal layer 5 and metal plate film 9. In addition, metal layer 5 may be formed by means of a non-electro plating method, a deposition lift method, a combination of sputtering and lift off methods, or a combination of non-electroplating and electroplating methods. Metal plate film 9 may also be formed by means of the non-electroplating method rather than the electroplating method. Metal plate film 9 is formed partially overlapping Au plate film 11. The thickness of Au plate film 11 is at least 1 μm to at most 50 μm.

The structure of the semiconductor chip thus formed will now be described.

Figure 15:
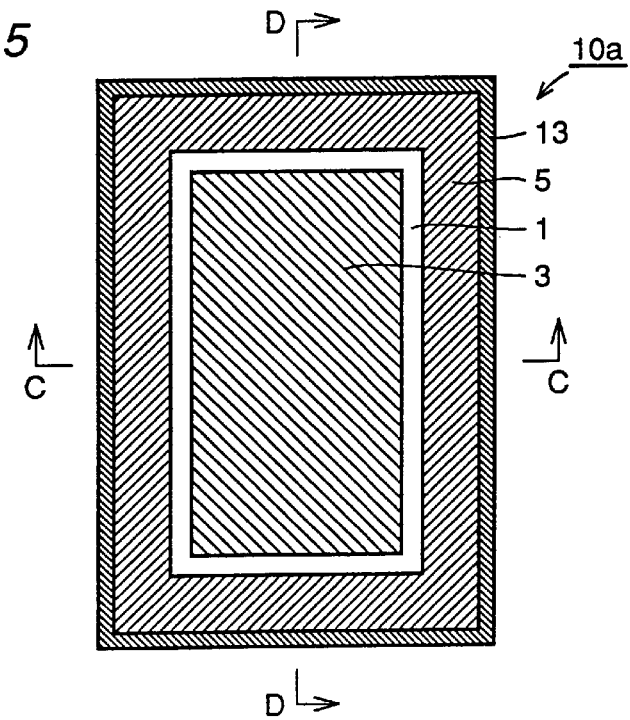
FIG. 15 is a plan view schematically showing the structure of the semiconductor device according to the first embodiment of the present invention.
Figure 16:
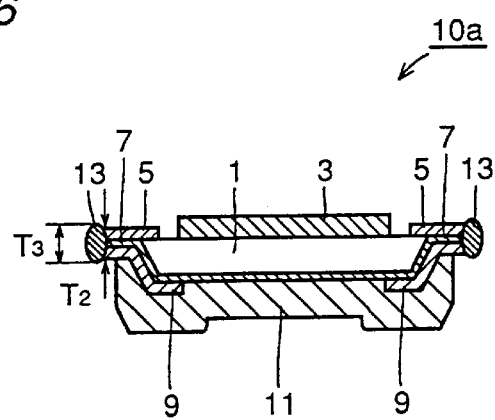
FIG. 16 is a schematic cross sectional view taken along the line C—C in FIG. 15.
Figure 17:
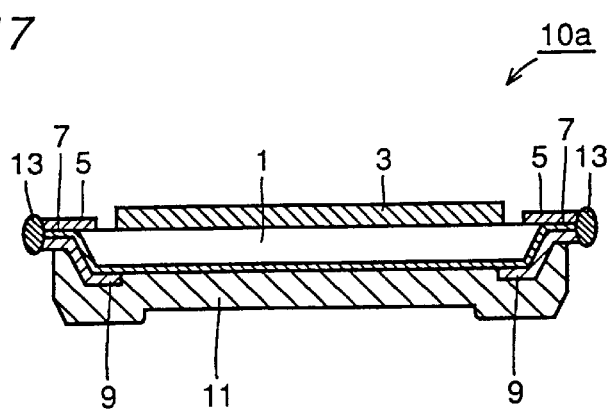
FIG. 17 is a schematic cross sectional view taken along the line D—D in FIG. 15.

FIG. 15 is a plan view schematically showing the structure of the semiconductor chip according to the first embodiment of the present invention. FIGS. 16 and 17 are schematic cross sectional views taken along the lines C—C and D—D in FIG. 15.

Referring to FIGS. 15 to 17, metal layer 5 is formed at the end of the surface of semiconductor layer 1, on which functional device 3 is formed. Metal layer 5 surrounds the periphery of functional device 3 with a prescribed space therebetween, and outwardly protrudes from the outer periphery end of semiconductor layer 1.

Metal layer 7 is also formed to cover the entire surface of semiconductor layer 1. Metal layer 7 is in contact with the back surface of metal layer 5. Metal plate film 9 is formed on metal layer 7 at the side end of the back surface of semiconductor layer 1. In addition, at the ends of metal layers 7 and 5 and metal plate film 9, metal lump 13 of the round form is formed, which results from the metal solidified after being once melted by laser beam. A thickness $T_3$ of metal lump 13 is at most three times the sum of thicknesses $T_2$ of metal layers 5 and 7 and metal plate film 9. Au plate film 11 is formed to cover the back surface of semiconductor layer 1.

Preferably, metal layer 5 has a low reflectivity for YAG (Yttrium Aluminum Garnet) laser, and is at least formed of metal with the reflectivity for YAG laser of 80% or less, such as Ni or Cr. If metal layer 5 is formed of an Au layer which has the reflectivity for YAG laser higher than 80%, fusion of the Au layer can be achieved by increasing the energy for laser beam. However, if the energy for laser beam is increased, in fusing the Au layer, underlying expand sheet 23 may be damaged by laser beam.

As shown in FIG. 11, sum of thicknesses $T_1$ of metal layers 5 and 7 and metal plated film 9 is at least 0.5 μm to at most 50 μm. If thickness $T_1$ is smaller than 0.5 μm, semiconductor wafer 4a with the thickness of 50 μm or less as shown in FIGS. 12 and 13 cannot be handled in a wafer form when removing it from reinforcing plate 21. If thickness $T_1$ is greater than 50 μm, on the other hand, even when material with high absorption rate for the energy of laser beam (low reflectivity) is employed for metal layers 5, 7 and 9, expand sheet 23 may be damaged in fusing the metal layers.

The thickness of metal layer 5 is between 0.2 μm and 50 μm. The thickness of at least 0.2 μm is required for connecting the semiconductor devices in retaining the alignment thereof during the processing steps starting from the etching of the wafer from its back surface shown in FIG. 10. If the thickness is greater than 50 μm, the expand sheet may be damaged by laser beam in fusing the metal layer by laser beam, as mentioned above. Therefore, the thickness of metal layer 5 is preferably 50 μm or less considering the case where metal layer 7 and metal plate film 9 are not included.

While the thickness of Au plate film 11 is preferably at least 10 μm to at most 50 μm, it may be formed of a deposition film having a thickness of at least 1000Å.

In addition, if the thickness of semiconductor layer 1 is at least 30 μm to at most 600 μm, the method of the present embodiment is suitably employed.

Further, a distance $T_4$ between metal layers 5, 7, 9, which are layered as shown in FIG. 13, and expand sheet 23 needs only be at least one fourth the sum of thicknesses $T_2$ (shown in FIG. 16) of layered metal layers 5, 7, 9. Distance $T_4$ thus set can prevent expand sheet 23 from being thermally damaged by the fused metal directly, which has absorbed the energy for laser beam in fusing layered metal layers 5, 7, 9 by laser beam.

In the method of manufacturing the semiconductor device according to the present embodiment, semiconductor wafer 4a is divided into semiconductor chips 10a by means of etching shown in FIG. 10 and laser melting shown in FIG. 14. Thus, unlike the conventional example, the semiconductor wafer is not divided by dicing. Therefore, clogging with the metal layer or wearing of the dicing saw is prevented.

Referring to FIGS. 12 and 13, semiconductor layers 1, which were separated from semiconductor wafer 4a when reinforcing plate 21 was removed from semiconductor wafer 4a, are connected together by metal layer 5. Thus, semiconductor chips 10a are not scattering in the organic solvent. Metal layer 5 or the like is finally fused by laser beam to provide separate semiconductor chips, as shown in FIG. 14. Thus, separate semiconductor chips 10a does not scatter even after being divided by laser beam. Therefore, additional time required for recovery of scattering separate semiconductor chips 10a is avoided. In addition, deterioration of the appearance caused by the scattering semiconductor chip 10a colliding with one another and by the fragments of the semiconductor device adhering to the chip is prevented.

Each of semiconductor layers 1, which has been separated from semiconductor wafer 4a, is connected by metal layer 5. Thus, semiconductor wafer 4a can still be maintained in a wafer form even after it is removed from reinforcing plate 21. As a result, an automatic test apparatus can advantageously be used for testing the characteristics of functional device 3 or the like.

Second Embodiment

FIGS. 18 to 24 are schematic cross sectional views sequentially showing the steps of the method of manufacturing the semiconductor device according to the second embodiment of the present invention. Cross sectional views shown in FIGS. 18 to 24 respectively correspond to the schematic cross sectional views partially showing the portions taken along the lines A—A in FIGS. 1 to 7, shown in conjunction with the first embodiment.

Figure 18:
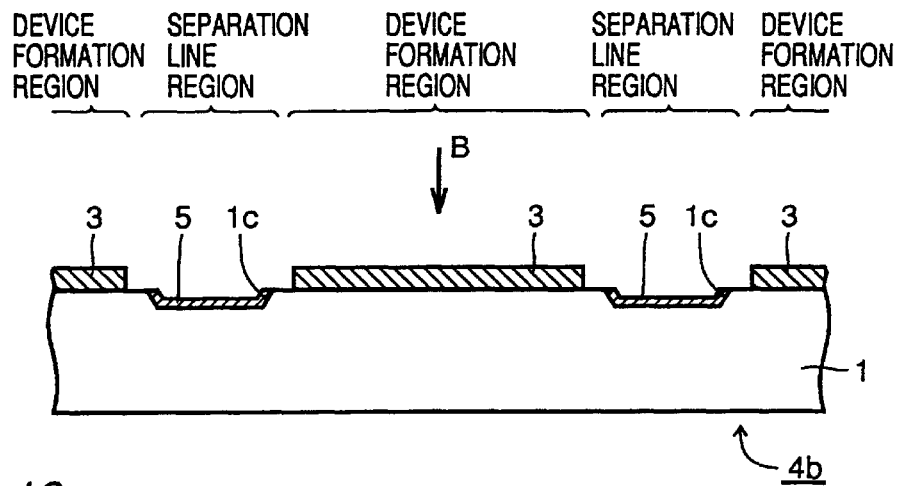
FIG. 18 is a cross sectional view showing a first step of a method of manufacturing a semiconductor device according to a second embodiment of the present invention.
Figure 19:
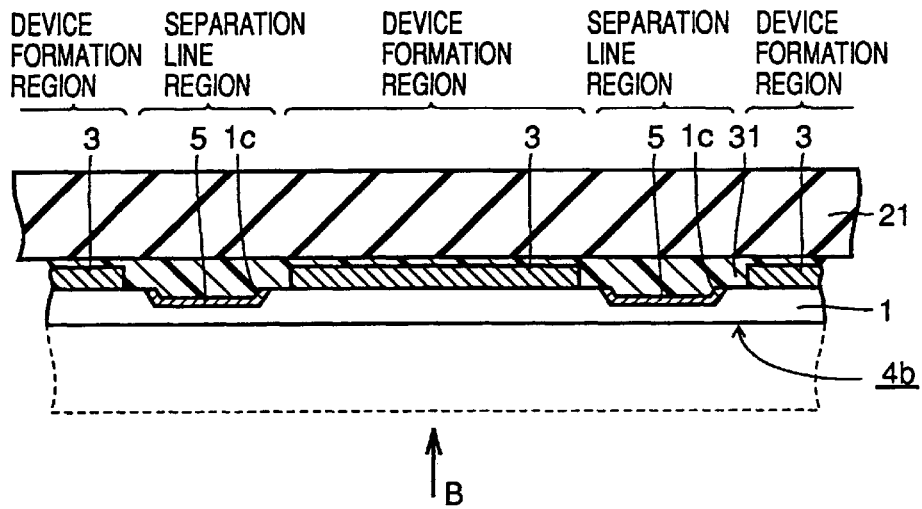
FIG. 19 is a schematic cross sectional view showing a second step of the method of manufacturing the semiconductor device according to the second embodiment of the present invention.
Figure 20:
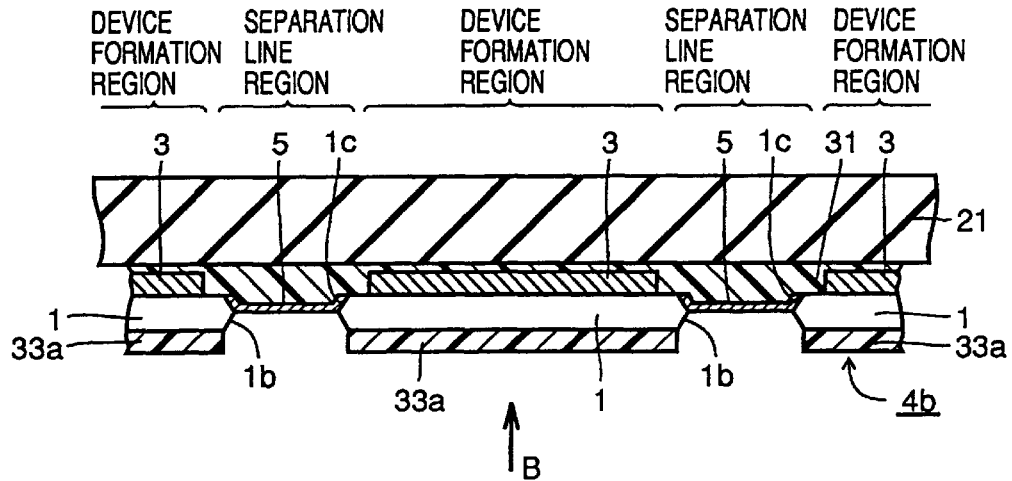
FIG. 20 is a schematic cross sectional view showing a third step of the method of manufacturing the semiconductor device according to the second embodiment of the present invention.
Figure 21:
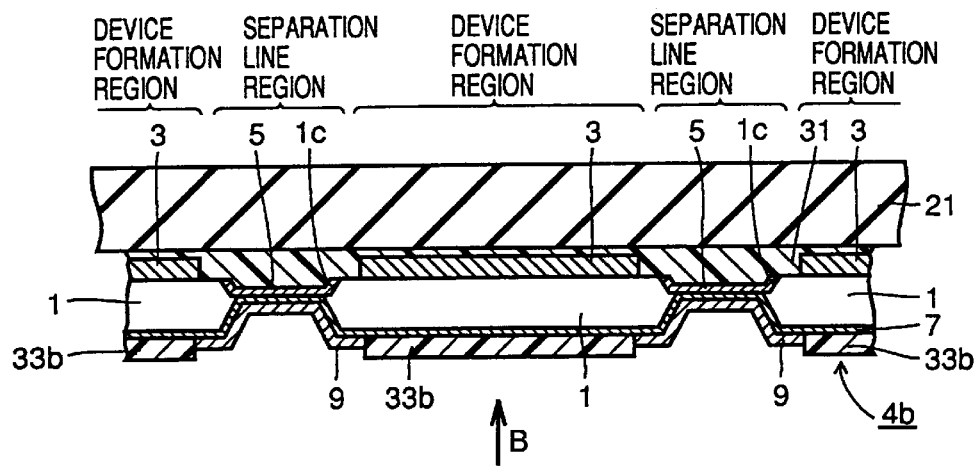
FIG. 21 is a schematic cross sectional view showing a fourth step of the method of manufacturing the semiconductor device according to the second embodiment of the present invention.
Figure 22:
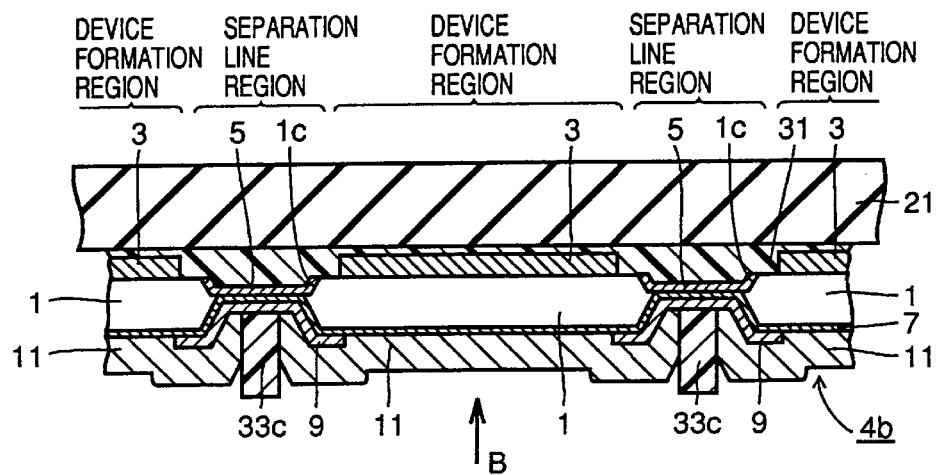
FIG. 22 is a schematic cross sectional view showing a fifth step of the method of manufacturing the semiconductor device according to the second embodiment of the present invention.
Figure 23:
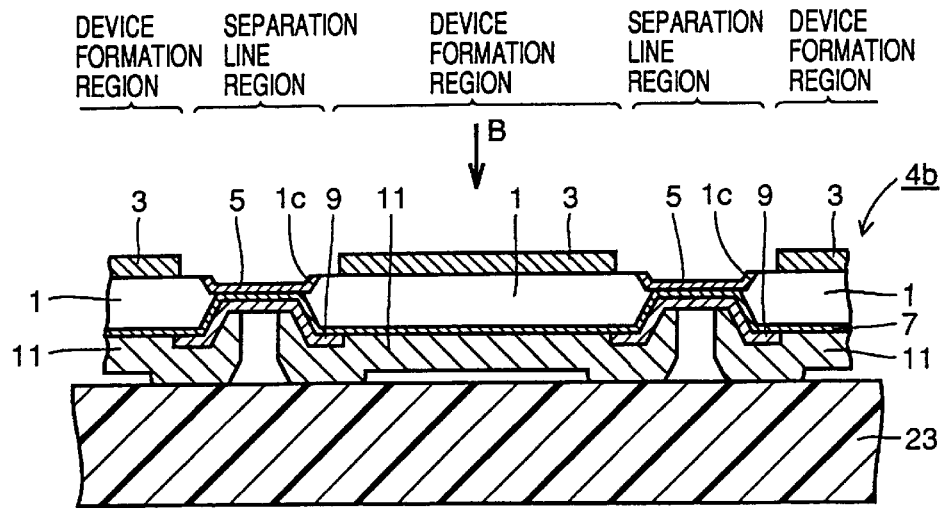
FIG. 23 is a schematic cross sectional view showing a sixth step of the method of manufacturing the semiconductor device according to the second embodiment of the present invention.
Figure 24:
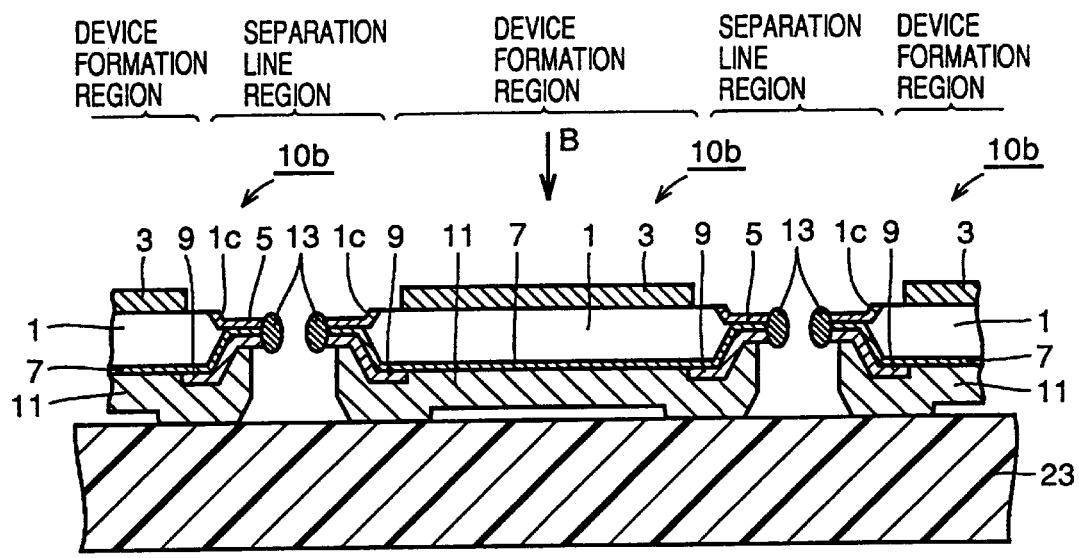
FIG. 24 is a schematic cross sectional view showing a seventh step of the method of manufacturing the semiconductor device according to the second embodiment of the present invention.

Referring firstly to FIGS. 1 and 18, in the present embodiment, a groove 1c is preliminary formed in the surface of the separation line region of the semiconductor layer 1 of semiconductor wafer 4b, unlike the first embodiment. Groove 1c is formed along the separation line region by means of etching, with a depth of at least 5 μm, but not greater than a depth which allows groove 1c to pass through semiconductor layer 1. Metal layer 5 is formed to cover the inner wall of groove 1c provided in the separation line region.

Desirably, groove 1c is tapered such that its inner diameter becomes smaller as deeper from the surface of semiconductor layer 1.

Thereafter, as shown in FIGS. 19 to 24, through the steps similar to those for the first embodiment shown in FIGS. 2 to 7 and in FIGS. 9 to 14, semiconductor wafer 4b is divided into a plurality of semiconductor chips 10b.

It is noted that, in FIGS. 19 to 24, the parts denoted by the same reference characters as those for the first embodiment are the same as the parts described in the first embodiment.

The structure of the semiconductor chip of the present invention thus formed will now be described.

Figure 25:
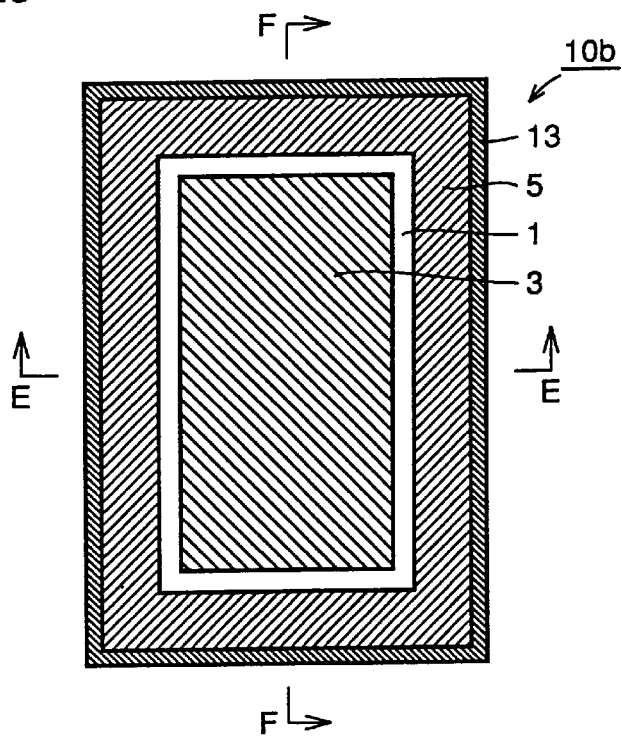
FIG. 25 is a plan view schematically showing the structure of the semiconductor device according to the second embodiment of the present invention.
Figure 26:
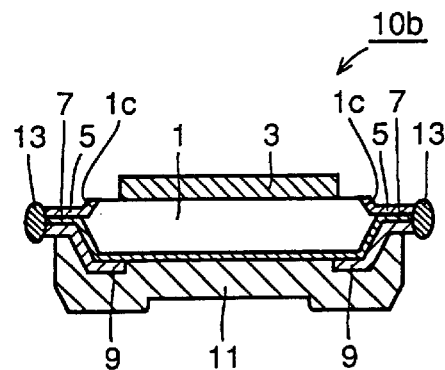
FIG. 26 is a cross sectional view taken along the line E—E in FIG. 25.
Figure 27:
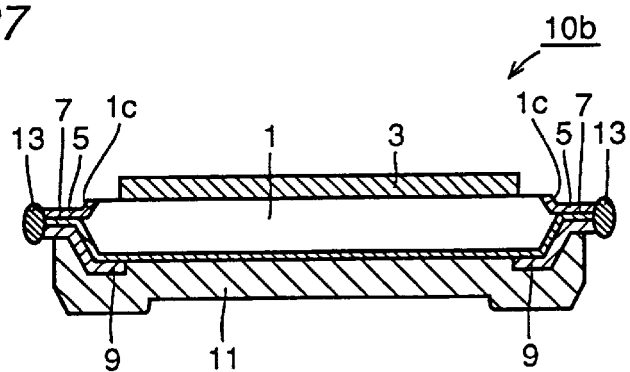
FIG. 27 is a schematic cross sectional view taken along the line F—F in FIG. 25.
Figure 28:
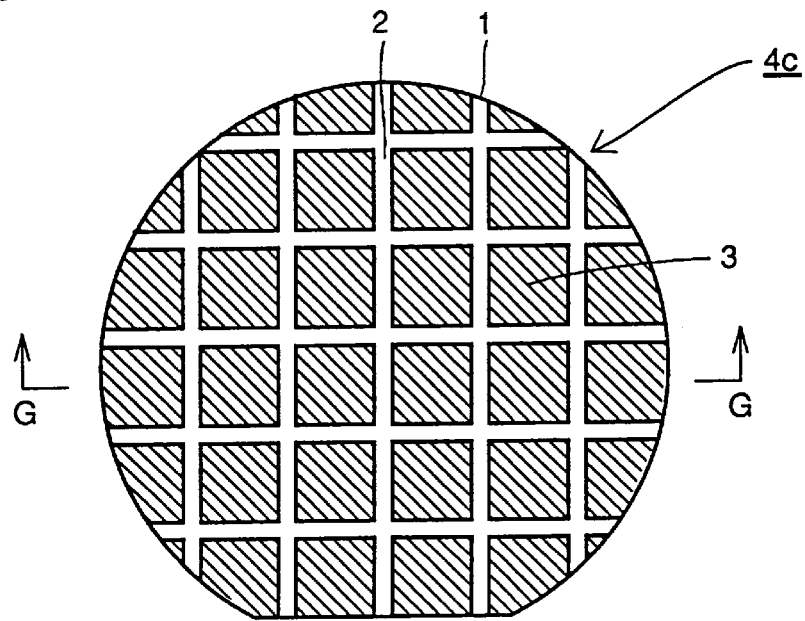
FIG. 28 is a schematic plan view showing a first step of a method of manufacturing a semiconductor device using a conventional dicing method.
Figure 29:
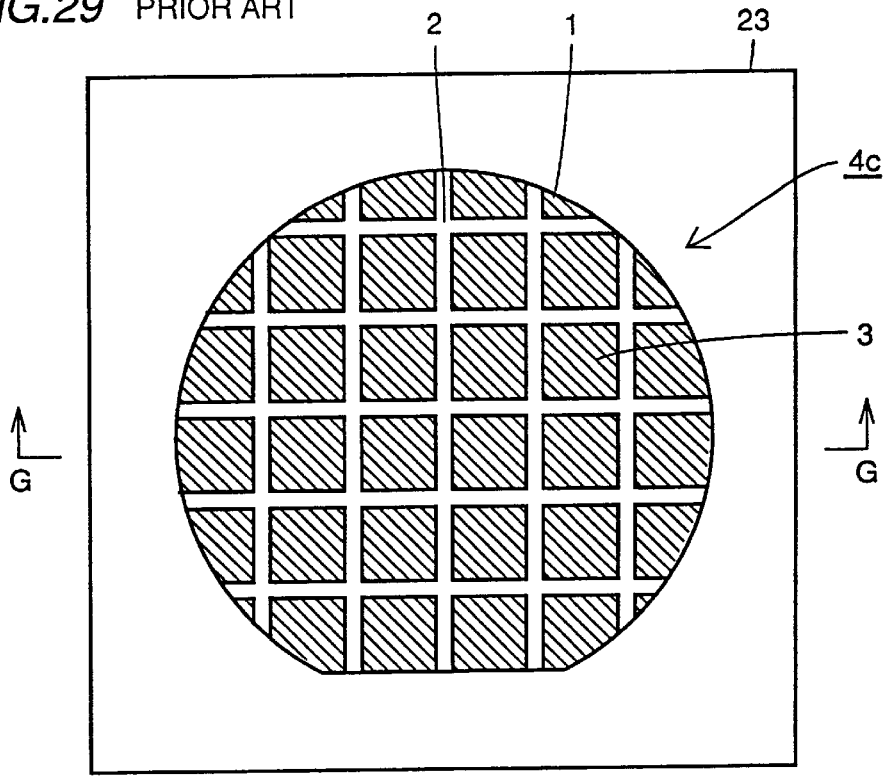
FIG. 29 is a schematic plan view showing a second step of the method of manufacturing the semiconductor device using the conventional dicing method.
Figure 30:
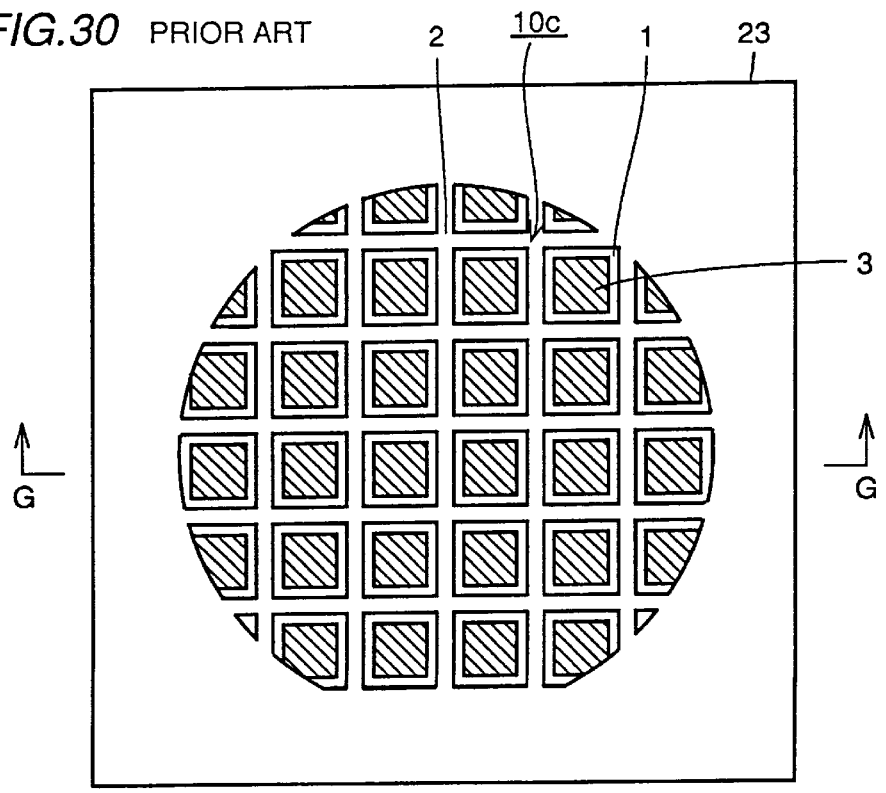
FIG. 30 is a schematic plan view showing a third step of the method of manufacturing the semiconductor device using the conventional dicing method.
Figure 31:
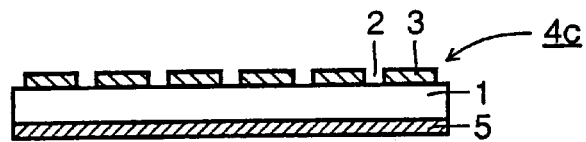
FIG. 31 is a schematic cross sectional view taken along the line G—G in FIG. 28.
Figure 32:
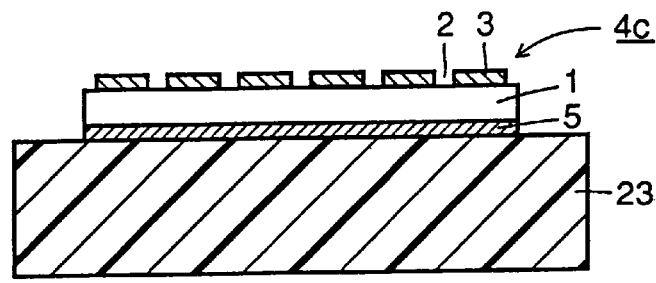
FIG. 32 is a schematic cross sectional view taken along the line G—G in FIG. 29.
Figure 33:
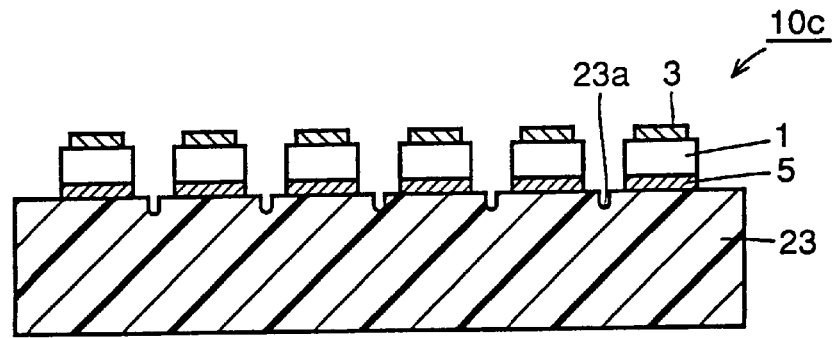
FIG. 33 is a schematic cross sectional view taken along the line G—G in FIG. 30.
Figure 34:
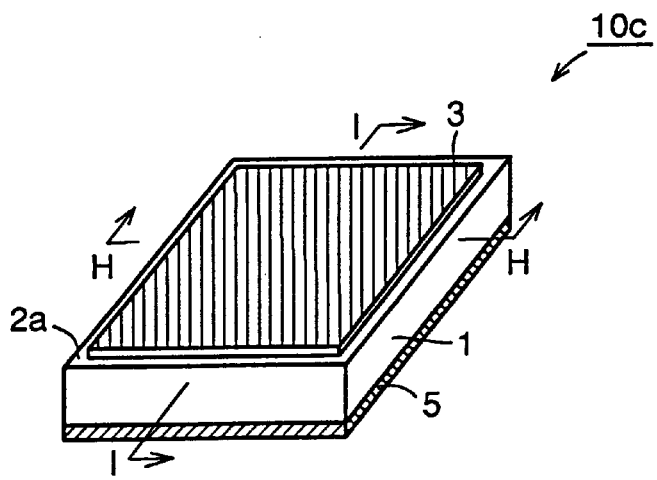
FIG. 34 is a perspective view schematically showing the structure of the semiconductor device manufactured by means of the conventional dicing method.
Figure 35:
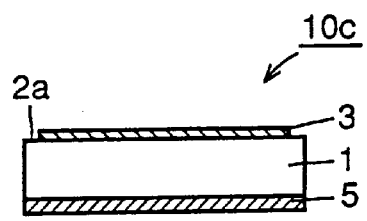
FIG. 35 is a schematic cross sectional view taken along the line H—H in FIG. 34.
Figure 36:
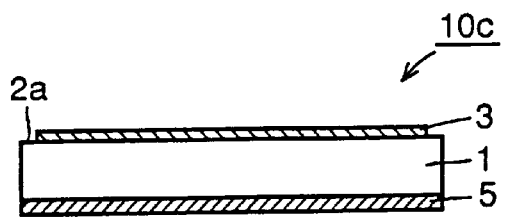
FIG. 36 is a schematic cross sectional view taken along the line I—I in FIG. 34.
Figure 37:
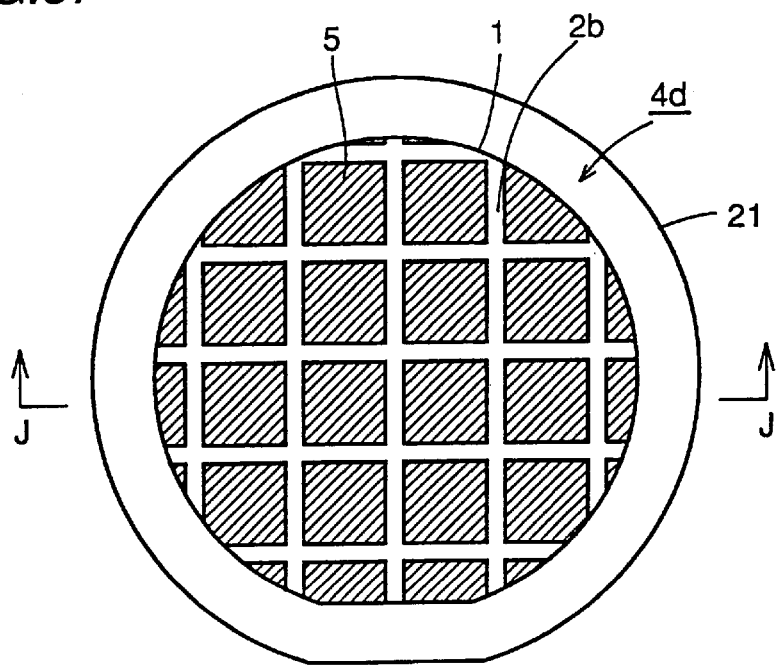
FIG. 37 is a schematic plan view showing a first step of a method of manufacturing a semiconductor device using a conventional wet etching method.
Figure 38:
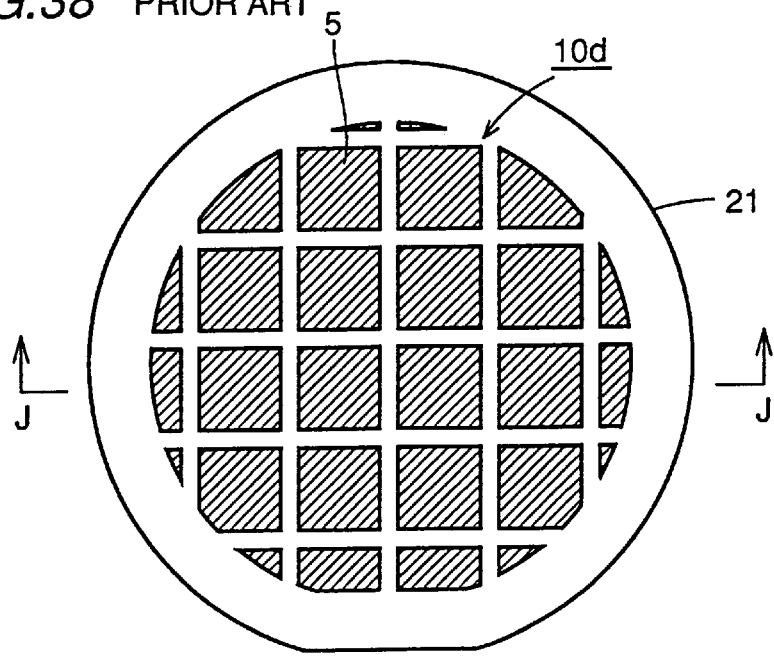
FIG. 38 is a schematic plan view showing a second step of the method of manufacturing the semiconductor device using the conventional wet etching method.
Figure 39:
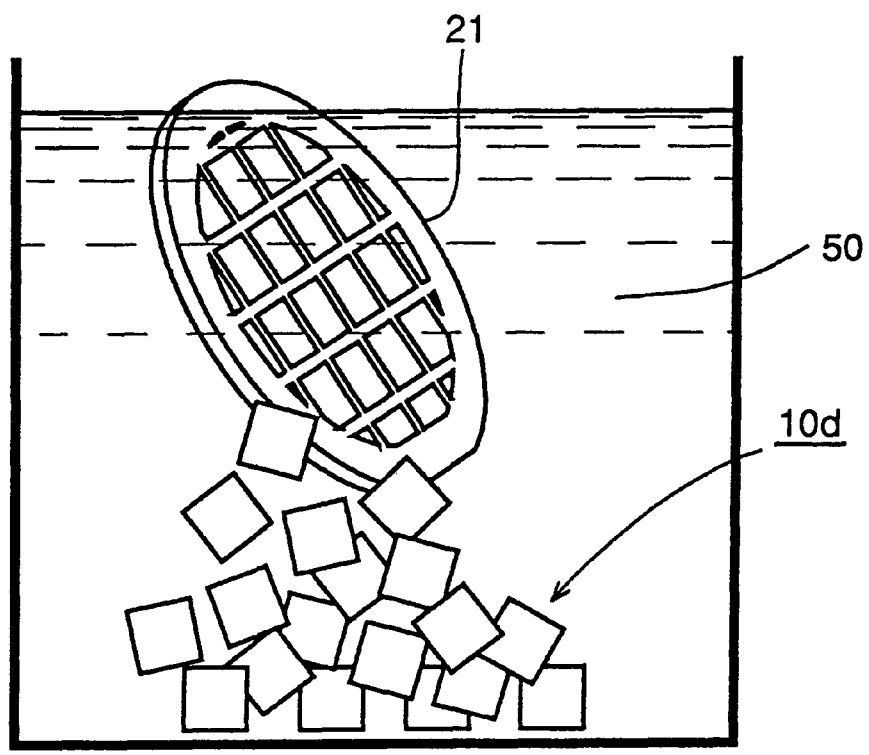
FIG. 39 is a schematic diagram showing the third step of the method of manufacturing the semiconductor device using the conventional wet etching method.
Figure 40:
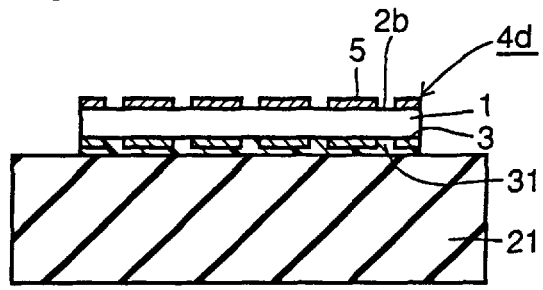
FIG. 40 is a schematic cross sectional view taken along the line J—J in FIG. 37.
Figure 41:
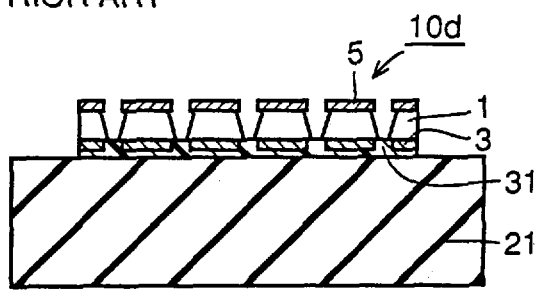
FIG. 41 is a schematic cross sectional view taken along the line J—J in FIG. 38.
Figure 42:
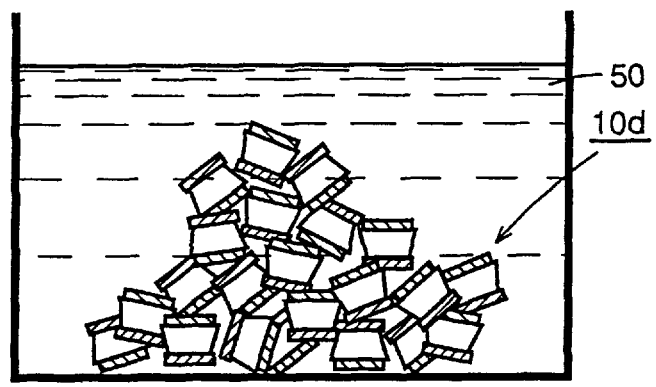
FIG. 42 is a schematic diagram showing semiconductor chips scattered in FIG. 39.
Figure 43:
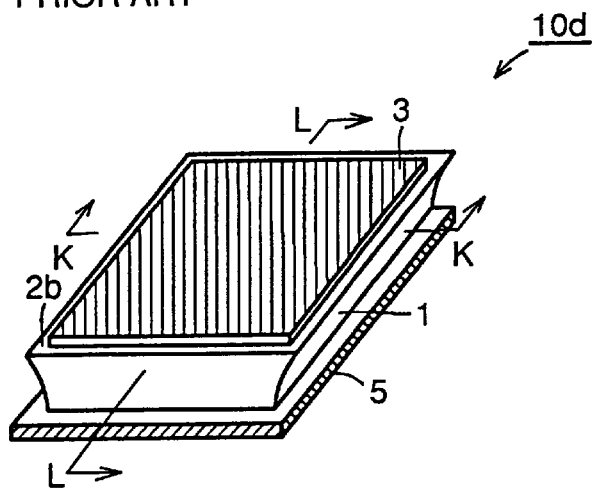
FIG. 43 is a perspective view schematically showing the structure of a semiconductor device manufactured by means of the conventional wet etching method.
Figure 44:
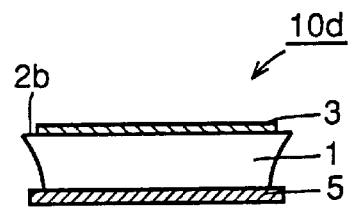
FIG. 44 is a schematic cross sectional view taken along the line K—K in FIG. 43.
Figure 45:
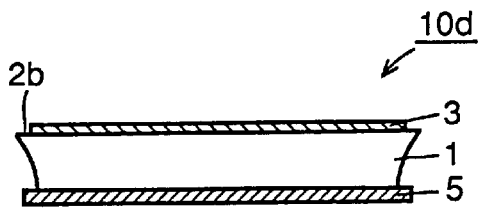
FIG. 45 is a schematic cross sectional view taken along the line L—L in FIG. 43.

FIG. 25 is a plan view schematically showing the structure of the semiconductor device according to the second embodiment of the present invention. FIGS. 26 and 27 are schematic cross sectional views taken along the lines E—E and F—F in FIG. 25.

Referring to FIGS. 25 to 27, in semiconductor chip 10b of the present embodiment, an inclined portion 1c is formed in the outer periphery region surrounding the region on which functional device 3 is formed on the surface of semiconductor layer 1. Metal layer 5 is formed to cover inclined portion 1c and outwardly protrudes from the outer periphery end of semiconductor layer.

It is noted that other parts of the structure are almost the same as those for the above mentioned first embodiment, the same parts are denoted by the same reference characters and the description thereof will not be repeated here.

In the present embodiment, groove 1c is formed in the separation line region of semiconductor wafer 4b, and metal layer 5 is formed to cover groove 1c, as shown in FIG. 18. Because metal layer 5 is formed in groove 1c, it is spaced apart from functional device 3, unlike the first embodiment. Thus, even if splash of metal layer 5 (scattering melting substance) occurs in laser fusing metal layer 5 in the step shown in FIG. 24, scattering of the substance onto functional device 3 is prevented.

Further, in assembling the semiconductor device, a wire is not brought into contact with fused metal layer 5 during wire bonding.

On the other hand, in the first embodiment, metal layer 5 is directly formed on the surface of semiconductor layer 1 without any groove as shown in FIG. 8. Thus, distance $T_4$ between metal layers 5, 7, 9 and expand sheet 23 can be longer than that for the second embodiment, as shown in FIG. 13. Therefore, damage for expand sheet 23 can be prevented in laser fusing metal layers 5, 7, 9 shown in FIG. 14.

The embodiments disclosed herein are by way of example only and are not intended to be limiting. The scope of the present invention is limited only by the following claims rather than the foregoing description, and various alterations are intended to be within the scope of the claims and in the meaning equivalent thereto.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

preparing a semiconductor wafer having mutually opposite first and second main surfaces and including a semiconductor layer having a plurality of device formation regions with functional devices, and a separation region surrounding peripheries of said device formation regions in both said first and second main surfaces for separating said plurality of device formation regions from one another;

forming a metal layer on said first main surface of said semiconductor layer in said separation region to surround said peripheries of said device formation regions;

applying a reinforcing layer to said semiconductor wafer to cover an entire surface of said first main surface;

selectively etching said separation region of said second main surface of said semiconductor layer to form a hole passing from said second main surface only to said metal layer and surrounding said device formation regions;

removing said reinforcing layer from said semiconductor wafer; and irradiating said metal layer with laser for fusing and disconnecting said metal layer to divide said plurality of device formation regions into separate semiconductor chips.

2. The method of manufacturing the semiconductor device according to claim 1, further including the steps of:

applying an expandable sheet to said second main surface of said semiconductor wafer after removing said reinforcing plate from said semiconductor wafer; and increasing spaces between said plurality of semiconductor chips by expanding said sheet after said plurality of device formation regions are separated from one another by irradiating said metal layer with said laser from a side of said first main surface.

3. The method of manufacturing the semiconductor device according to claim 1, wherein said semiconductor wafer is prepared to have a groove surrounding said peripheries of said device formation regions in said separation region of said first main surface, and said metal layer is formed in said groove of said first main surface.

4. The method of manufacturing the semiconductor device according to claim 1, further including the step of forming a second metal layer covering an entire surface of said second main surface of said semiconductor layer and being in contact with said metal layer after forming said hole, said metal layer and said second metal layer are fused and disconnected by said laser irradiation.

* * * * *